United States Patent
Tai et al.

(10) Patent No.: US 9,640,393 B2
(45) Date of Patent: May 2, 2017

(54) SUBSTRATE WITH CRYSTALLIZED SILICON FILM AND MANUFACTURING METHOD THEREOF

(71) Applicant: National Tsing Hua University, Hsinchu (TW)

(72) Inventors: Nyan-Hwa Tai, Hsinchu (TW); Chi-Young Lee, Hsinchu (TW); Ping-Yen Hsieh, Hsinchu (TW)

(73) Assignee: NATIONAL TSING HUA UNIVERSITY, Hsinchu (TW)

( * ) Notice: Subject to any disclaimer, the term of this patent is extended or adjusted under 35 U.S.C. 154(b) by 0 days.

(21) Appl. No.: 15/227,454

(22) Filed: Aug. 3, 2016

(65) Prior Publication Data

US 2016/0343566 A1 Nov. 24, 2016

Related U.S. Application Data

(62) Division of application No. 14/539,738, filed on Nov. 12, 2014, now Pat. No. 9,443,924.

(30) Foreign Application Priority Data

Jul. 17, 2014 (TW) .............................. 103124510 A

(51) Int. Cl.
*C23C 16/448* (2006.01)
*H01J 37/32* (2006.01)
(Continued)

(52) U.S. Cl.
CPC .... *H01L 21/0262* (2013.01); *H01L 21/02422* (2013.01); *H01L 21/02532* (2013.01); *H01L 29/045* (2013.01); *H01L 29/16* (2013.01)

(58) Field of Classification Search
CPC ............... H01L 31/1824; H01L 31/202; H01L 21/0242; H01L 21/0245; H01L 21/02507;
(Continued)

(56) References Cited

U.S. PATENT DOCUMENTS 5,099,790 A * 3/1992 Kawakami ............ C23C 16/511
118/723 MR
2003/0229190 A1 12/2003 Aoki
(Continued)

FOREIGN PATENT DOCUMENTS

TW 200822191 A 5/2008
TW 201243094 A 11/2012

OTHER PUBLICATIONS

L. Zhang et al., "Effect of argon on the structure of hydrogenated nanocrystalline silicon deposited from tetrachlorosilane/hydrogen/argon plasma," Phys. Status Solidi A, 2012, pp. 1-5.
(Continued)

*Primary Examiner* — Kimberly Rizkallah
*Assistant Examiner* — Brian Turner
(74) *Attorney, Agent, or Firm* — Muncy, Geissler, Olds & Lowe, P.C.

(57) ABSTRACT

The present invention relates to a substrate with a crystallized silicon film and manufacturing method thereof, wherein the substrate with the crystallized silicon film comprises: a substrate, which is a polymer substrate; and a crystallized silicon film, which is formed on at least one surface of the substrate, wherein the crystallized silicon film comprises a plurality of silicon crystals with column structures, and the crystallinity of the crystallized silicon film is higher than 90%.

11 Claims, 10 Drawing Sheets

(51) Int. Cl.
  *H01L 27/12* (2006.01)
  *H01L 29/66* (2006.01)
  *H01L 29/786* (2006.01)
  *H01L 21/70* (2006.01)
  *H01L 31/077* (2012.01)
  *H01L 21/02* (2006.01)
  *H01L 29/04* (2006.01)
  *H01L 29/16* (2006.01)

(58) Field of Classification Search
  CPC ........... H01L 21/02532; H01L 21/0262; H01L 21/02595; H01L 29/78696; C23C 16/26
  USPC ....... 257/59, E33.056, 347, 75; 438/28, 481, 438/158, 482
  See application file for complete search history.

(56) References Cited

U.S. PATENT DOCUMENTS

| | | |
|---|---|---|
| 2004/0051142 A1 | 3/2004 | Yamazaki |
| 2006/0079037 A1 | 4/2006 | Hoffman |
| 2007/0235841 A1* | 10/2007 | Ge .................... B82Y 10/00 257/627 |
| 2007/0254165 A1 | 11/2007 | Tran Quoc |
| 2008/0119030 A1 | 5/2008 | Kunii |
| 2008/0188062 A1* | 8/2008 | Chen ............... H01L 21/02403 438/483 |
| 2009/0200551 A1 | 8/2009 | Won |
| 2010/0059110 A1* | 3/2010 | Sheng ................ C23C 16/325 136/255 |
| 2011/0089429 A1 | 4/2011 | Prabhakar |
| 2011/0223697 A1 | 9/2011 | Yong-Hwan |

OTHER PUBLICATIONS

X. Lin et al., "Growth mechanism of polycrystalline silicon films from hydrogen-diluted $SiCl_4$ at low temperature," Journal of Applied Physics, 98, 034907, 2005, pp. 1-4.

R. Huang et al., Investigation on the initial growth of nanocrystalline silicon prepared from hydrogen-diluted $SiCl_4$ at low tempeatures, J. Phys. D: Appl. Phys. 39, 2006, pp. 4423-4428.

Li, Handong, "Nano-structured PECVD silicon films and their device applications", Pennsylvania State University, May 2004, Thesis, 32 pages.

* cited by examiner

SUBSTRATE WITH CRYSTALLIZED SILICON FILM AND MANUFACTURING METHOD THEREOF

CROSS REFERENCE TO RELATED APPLICATION

This application is a Divisional of co-pending application Ser. No. 14/539,738, filed on Nov. 12, 2014, for which priority is claimed under 35 U.S.C. §120; and this application claims the benefits of the Taiwan Patent Application Serial Number 103124510, filed on Jul. 17, 2014, under 35 U.S.C. §119, the subject matter of which is incorporated herein by reference.

BACKGROUND OF THE INVENTION

1. Field of the Invention

The present invention relates to a substrate with a crystallized silicon film and a manufacturing method thereof. Specifically, the present invention relates to a substrate a with crystallized silicon film with high crystallinity, high adhesiveness, and excellent optoelectronic properties, which is formed by depositing silicon chloride as a precursor on a flexible substrate through microwave plasma enhanced chemical vapor deposition.

2. Description of Related Art

Recently, industries are desirable to develop thinner and lighter electronic devices with multiple functions and low manufacturing cost to meet customers' needs. In order to satisfy the needs described above, the industries focus on using flexible polymer substrates for lightening the electronic devices. The use of the flexible polymer substrates in the electronic devices not only can expand the application ranges and market values of the electronic devices, but also can reduce the manufacturing cost thereof due to the applications of a roll-to-roll process. However, the polymer substrate generally has a lower melting point, such that the applications of the polymer substrate are limited, and the manufacturing processes for the electronic devices are also limited.

The manufacturing process of flexible optoelectronic devices with the amorphous silicon film has been fully developed. However, the said development of flexible optoelectronic devices is still restricted due to the unstable optoelectronic properties of the amorphous silicon film. Nowadays, it is known that the crystallized silicon film has better optoelectronic properties and carrier mobility than the amorphous silicon film, which improves many disadvantages of the amorphous silicon film.

The recent methods for manufacturing crystallized silicon film mainly comprise: solid phase crystallization, excimer laser annealing, metal-induced crystallization, and direct deposition. The process of solid phase crystallization includes the step of heating the silicon material in a prolonged duration time to re-nucleate silicon atoms. However, the process temperature thereof have to be 600° C. or higher. The process of excimer laser annealing includes the step of irradiating the amorphous silicon film with high energy laser to instantaneously melt the amorphous silicon film and then recrystallize to form the crystallized silicon film. However, the process temperature thereof have to be 400~600° C. The process of metal-induced crystallization includes the step of adding a specific metal into the amorphous silicon film to induce the eutectic reaction between the metal and the amorphous silicon, or to form the metal silicide thereof, to lower the temperature required for solid phase crystallization to about 250~500° C. In addition, the process of direct deposition is performed by physical vapor deposition, thermal chemical vapor deposition, plasma enhanced chemical vapor deposition, or hot filament chemical vapor deposition in combination with a process of heating the base, high density plasma assisting apparatus or laser treatment to sufficiently grow the crystallized silicon film. However, the process temperature thereof might still be 250~350° C.

According to the above mentioned techniques for manufacturing the crystallized silicon film, the former three methods require high temperature for recrystallization of the amorphous silicon. Even the process temperature for direct deposition method is relatively lower, it still has to be 250~500° C. In addition, the crystallinity of the crystallized silicon films prepared by the above mentioned methods are rather low. Due to the low melting temperature of the flexible polymer substrate, it is difficult to directly form a crystallized silicon film with high crystallinity and excellent optoelectronic properties on a flexible polymer substrate.

Accordingly, it is desirable to provide a method of directly forming a crystallized silicon film with high crystallinity on a flexible polymer substrate, which is beneficial to the development of slimmer and lighter electronic devices.

SUMMARY OF THE INVENTION

The object of the present invention is to provide a substrate with a crystallized silicon film and a manufacturing method thereof, wherein the substrate with the crystallized silicon film is formed by performing microwave plasma enhanced chemical vapor deposition on at least one surface of a flexible substrate with silicon chloride as a precursor in a low-temperature condition.

The present invention provides a substrate with a crystallized silicon film, comprising a substrate, and a crystallized silicon film, wherein the said substrate is preferred to be a polymer substrate, and the said crystallized silicon film is formed on at least one surface of the substrate. A crystallinity of the crystallized silicon film is more than 90%, and the crystallized silicon film comprises a plurality of silicon crystals with column structures.

The Raman spectroscopy of silicon material has three main signals, which are: the amorphous phase at about 480 $cm^{-1}$, the mesophase (also called as nano crystalline phase) at about 500 $cm^{-1}$, and crystalline phase at about 520 $cm^{-1}$. As the crystallinity of the silicon material and the size of the crystal grain increase, the signal of the Raman spectroscopy becomes nearer to 520 $cm^{-1}$. Further, after fitting the Raman spectroscopy with Gaussian functions, the crystallinity of the silicon material can be calculated by the integrated area of the signals. In the said substrate with crystallized silicon film, the Raman spectroscopy thereof mainly has a peak at 510~520 $cm^{-1}$, and is preferred to have a peak at about 520 $cm^{-1}$.

In the said substrate with crystallized silicon film, the X-ray diffraction pattern of the crystallized silicon film measured by Cu Kα irradiation has diffraction peaks at diffraction angles of 20~60 degree, which respectively are [111] orientation at 28.4 degree, [220] orientation at 47.3 degree, and [311] orientation of 56.1 degree.

Higher relative intensity and narrower full width at half maximum of the diffraction peaks indicate the measured silicon film having better crystallinity. In addition, according to the X-ray diffraction pattern, the silicon crystals of the crystallized silicon film have a preferred crystalline orientation of [220].

The present technique is able to prepare the crystallized silicon film with high growth rate, wherein the growth rate of the film may be 100 nm/min or higher, and is preferred to be 100 nm/min to 150 nm/min. With regard to the said silicon crystals with column structures, the particle sizes of the crystal grains thereof are not particularly limited. According to the present embodiments, the particle sizes thereof may be about 61.40~88.18 nm, wherein the maximum particle sizes thereof are about 88.18 nm. Further, the heights of the crystal grains of the said silicon crystals with the column structures are not particularly limited, which can be adjusted by the process time, and can be, for example, among 1~3 μm.

In the substrate with the crystallized silicon film of the present invention, the applicable substrate is not particularly limited, and is preferred to be a flexible polymer substrate. The melting point of the substrate is not particularly limited, which may be 185~400° C., wherein 185~350° C. is preferred, 185~300° C. is more preferred, and 185~250° C. is most preferred. The material of the flexible polymer substrate that satisfies the requirements mentioned above may be, for example, polyimide (PI), polyethersulfone (PES), or Polyetheretherketone (PEEK), but the material of the flexible polymer substrate is not limited thereto. In addition, the thickness of the said substrate is not particularly limited as long as the substrate has a melting point that satisfies the above mentioned range, and the thickness of the substrate is preferred to be in the range of 100~200 μm.

Furthermore, in the substrate with crystallized silicon film of the present invention, the crystallized silicon film has excellent adhesion, flexibility, and optoelectronic properties. In the substrate with crystallized silicon film of the present invention, an adhesion level of the crystallized silicon film to the substrate is 5 B measured by the ASTM D3359-02 regulation. Further, the result of the bending test indicates that no cracks occur when the crystallized silicon film tightly attaches to the substrate. In addition, the conductivity of the crystallized silicon may reach $10^{-3}$~$10^{-1}$ S/cm while the substrate with crystallized silicon film is bended in positive angles (tensile stress) or negative angles (compressive stress). Especially, the conductivity thereof can be significantly increased when the substrate of the present invention is bended in the negative angles; and the conductivity thereof is not significantly reduced when the substrate is bended in the positive angles. According to the analytical result of Microwave photoconductive decay (μ-PCD), a carrier lifetime of the crystallized silicon film is about 10~20 μs and a carrier mobility of the crystallized silicon film is about 100~150 cm$^2$/Vs, which are significantly higher than that of the amorphous silicon materials.

For the purpose of manufacturing the substrate with the crystallized silicon film with excellent adhesion, flexibility, and optoelectronic properties, another object of the present invention is to provide a manufacturing method of a substrate with a crystallized silicon film, which comprises the steps of: (A) providing a substrate, a silicon source and a hydrogen gas, wherein the substrate is a polymer substrate, and the silicon source is preferably $SiCl_4$, $Si_2Cl_6$, or a combination thereof (more preferably, $SiCl_4$); (B) placing the substrate into a reduced pressure environment of a pressure less than $10^{-2}$ torr, and using the hydrogen gas as a carrier gas to introduce the silicon source into the reduced pressure environment, wherein a flow rate of the carrier gas is 10-20 sccm; (C) introducing 50~600 sccm of the carrier gas additionally, and performing a microwave plasma enhanced chemical vapor deposition (MWPECVD) with a microwave power of 250~2000 W under an operation pressure of 1~10 torr; and (D) depositing a crystallized silicon film on at least one surface of the substrate to form the substrate with the crystallized silicon film.

In a preferred embodiment of the present invention, in the step of (B), the carrier gas of the hydrogen gas is injected into the liquid silicon source to introduce vapor of the liquid silicon source into the reduced pressure environment. The pressure of the reduced pressure environment may be less than $10^{-2}$ torr, and the flow rate of the carrier gas may be 10~20 sccm, wherein 10 sccm is preferable.

In the step of (C), when hydrogen serves as the carrier gas, the flow rate of the additional hydrogen is preferred to be 100~300 sccm, wherein 150~250 sccm is more preferable, and 200 sccm is most preferable. Accordingly, a crystallized silicon film having the best quality can be obtained.

Furthermore, in the step of (C), the MWPECVD is performed with a plasma density of $10^{12}$~$10^{13}$ under a temperature of 200° C. or less.

In the present invention, during the process of forming the crystallized silicon film by the reaction of hydrogen/silicon chloride performed with the microwave plasma, the exothermic reaction occurs when forming hydrogen chloride by the reaction of the hydrogen free radicals and the chlorine free radicals in the plasma, and the free radicals are capable of etching the weak Si—Si bond and Si—O bond of the impurities. Therefore, the manufacturing method of the present invention has etching effect, self-cleaning effect, and chemical annealing effect so that the crystallized silicon film with high crystallinity can be formed on the flexible substrate with low melting point. In addition, because the microwave plasma has a high plasma density, the crystallized silicon film with high crystallinity can be formed on the flexible substrate with low melting point by a low temperature process.

Accordingly, the manufacturing method of the present invention provides a simple process for forming the crystallized silicon film on the polymer substrate with low melting point, and especially the obtained crystallized silicon film on the polymer substrate with low melting point has high crystallinity, which cannot be accomplished by the conventional methods. Therefore, the manufacturing method of the present invention is applicable for manufacturing silicon thin film solar cells, thin film transistor, sensors, and the like, and thus thin portable devices with can be achieved and the conductivity thereof can also be improved.

In addition, the most preferred silicon source used in the present invention is $SiCl_4$, which is a terminal byproduct of preparing high purity single-crystal silicon wafer; therefore, $SiCl_4$ is accessible and inexpensive. Further, $SiCl_4$ is present in liquid at room temperature, so that $SiCl_4$ is safer and easier to be stored than $SiH_4$, which is usually used as the silicon source of chemical vapor deposition for forming silicon film. The microwave plasma enhanced chemical vapor deposition of the present invention is a vacuum process, which has the advantages of high density plasma and no electrode contamination, and can be used to prepare silicon film with large area. Therefore, it can be applied to the present vacuum process of the semiconductor industries.

DETAILED DESCRIPTION OF THE PREFERRED EMBODIMENT

Embodiment 1

The present embodiment uses polyimide (PI) as the flexible polymer substrate, and uses $SiCl_4$ as the silicon source.

Figure 1:
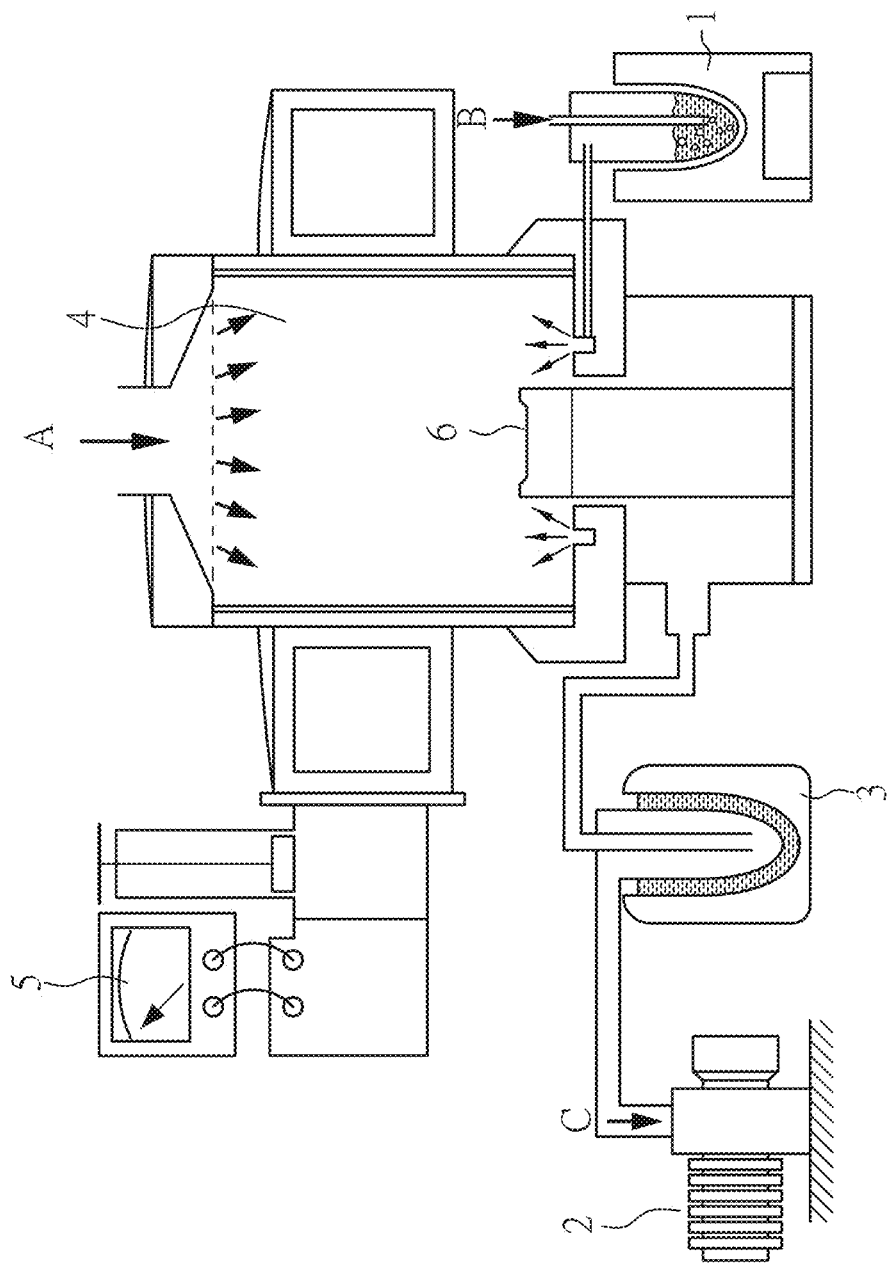
FIG. 1 is a schematic diagram of the microwave plasma enhanced chemical vapor deposition according to Embodiment 1 of the present invention.

With reference to FIG. 1, the $SiCl_4$ liquid is preserved in a −55° C. condensing well device 1 to reduce its volatilization. Then, oil-sealed mechanical pump is used as a vacuum pump 2 along with the liquid nitrogen condensing well 3 and starts pumping in direction C. Thus, the interior space of the reaction chamber 4 becomes a reduced pressure environment close to vacuum, and the hydrogen chloride byproduct produced during the reaction for forming the crystallized silicon film can be trapped to prevent the damage of the pumping device caused by the hydrogen chloride.

First, air in the reaction chamber 4 is removed by a pumping device to create the reduced pressure environment of extreme vacuum ($<10^{-2}$ torr), 50 sccm of argon gas is introduced in direction A, 500 W of microwave power is applied by a microwave power control device 5, and the introduced argon gas impacts a flexible polymer substrate located on the substrate holder 6 to clean the surface of the substrate for 5 minutes.

Then, 10 sccm of hydrogen is served as the carrier gas and liquid $SiCl_4$ is injected in direction B, and the carrier gas introduce the $SiCl_4$ vapor into the reduced pressure reaction chamber 4. As calculated, the practical gas flow rate of $SiCl_4$ is $2.9 \times 10^{-2}$ sccm. At the meantime, 200 sccm of hydrogen is additionally introduced into the reaction chamber 4 in direction A to adjust the total pressure of the reaction chamber. After the pressure of the reaction chamber 4 reaches 5 torr, MWPECVD is performed with different microwave power, such as 500 W, 750 W, and 1000 W, and the reaction time is 15 minutes. Meanwhile, the plasma density is about $10^{13}$, and the process temperature is 185° C.

After the manufacturing process, hydrogen is introduced into the reaction chamber 4 in direction A to reach the atmospheric pressure, the pressure is reduced by pumping in direction C using oil-sealed mechanical pump, the above steps is repeated for 5 times, and the vacuum is broken after the step of recovery. Thereby, the substrate with the crystallized silicon film is accomplished. The properties of the crystallized silicon film of the substrate with the crystallized silicon film will be tested through the following test examples.

Figure 2:
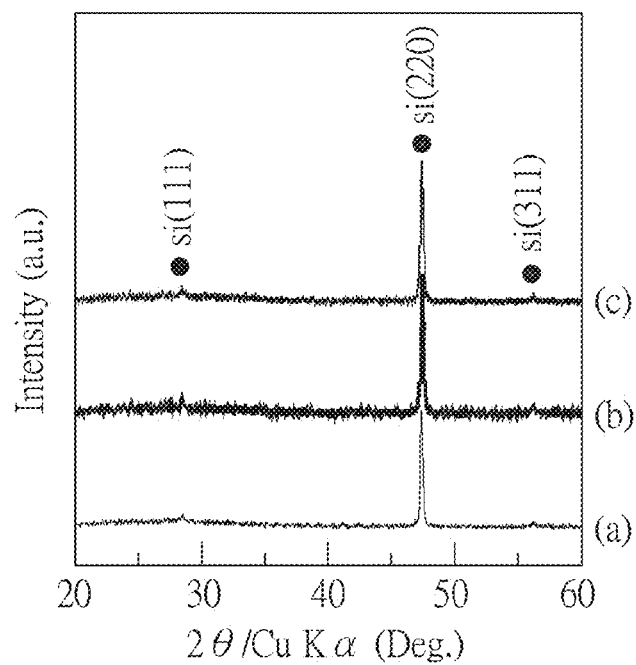
FIG. 2 is an X-ray diffraction pattern of the crystallized silicon film manufactured by applying different microwave power of (a) 500 W, (b) 750 W, and (c) 1000 W measured with Cu Kα irradiation according to Embodiment 1 of the present invention.
Figure 3:
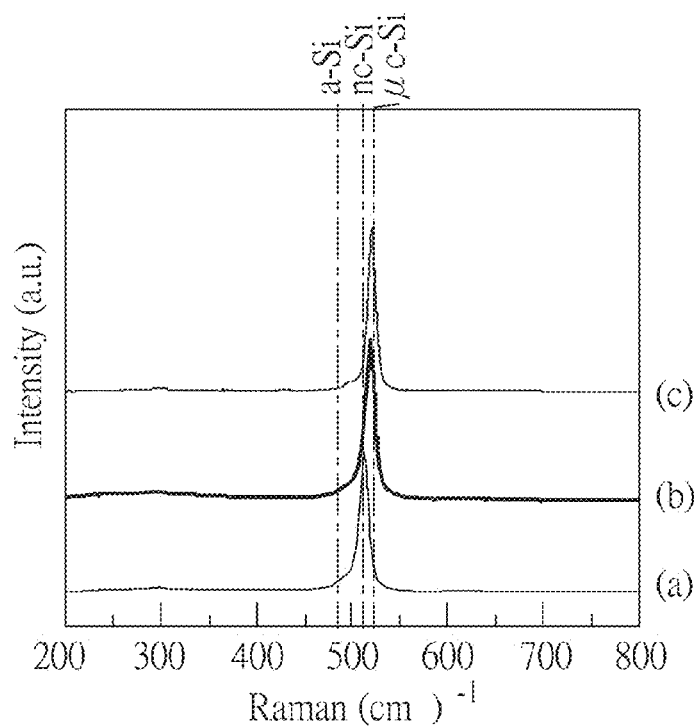
FIG. 3 is a Raman spectroscopy of the crystallized silicon film manufactured by applying different microwave power of (a) 500 W, (b) 750 W, and (c) 1000 W according to Embodiment 1 of the present invention.

[Test Example 1]—Measuring the Crystallinity of the Crystallized Silicon Film Formed on the Substrate and its Micro Structure With references to FIG. 2 and FIG. 3, FIG. 2 and FIG. 3 respectively show the X-ray diffraction pattern of the crystallized silicon film measured by Cu Kα irradiation and the Raman spectroscopy of the crystallized silicon film. As the result shown in FIG. 2, the crystallized silicon film of the above embodiment has crystallinity, and has a preferred crystalline orientation of [220]. In addition, in the X-ray diffraction pattern of the crystallized silicon film measured by Cu Kα irradiation, there are diffraction peaks of [111], [220], and [311] respectively located at 28.4 degree, 47.3 degree, and 56.1 degree.

Referring to the Raman spectroscopy of the crystallized silicon film shown in FIG. 3, there is a peak located at 510~520 $cm^{-1}$, and the crystallinity of the crystallized silicon film of the above embodiment is higher than 90% calculated from the result shown in FIG. 3.

Figure 4A:
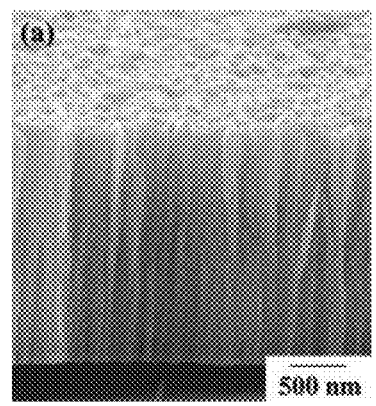
FIGS. 4A~4C are SEM images of the crystallized silicon film manufactured by applying different microwave power of (a) 500 W, (b) 750 W, and (c) 1000 W according to Embodiment 1 of the present invention.
Figure 4B:
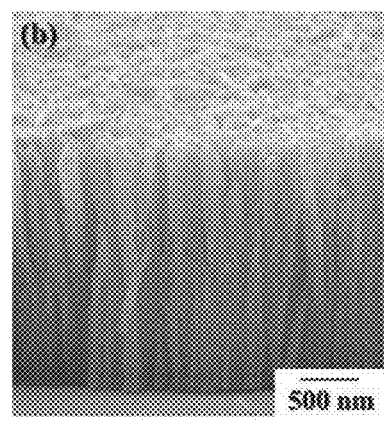
Figure 4C:
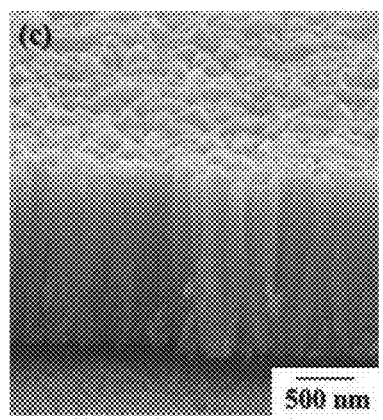
Figure 5:
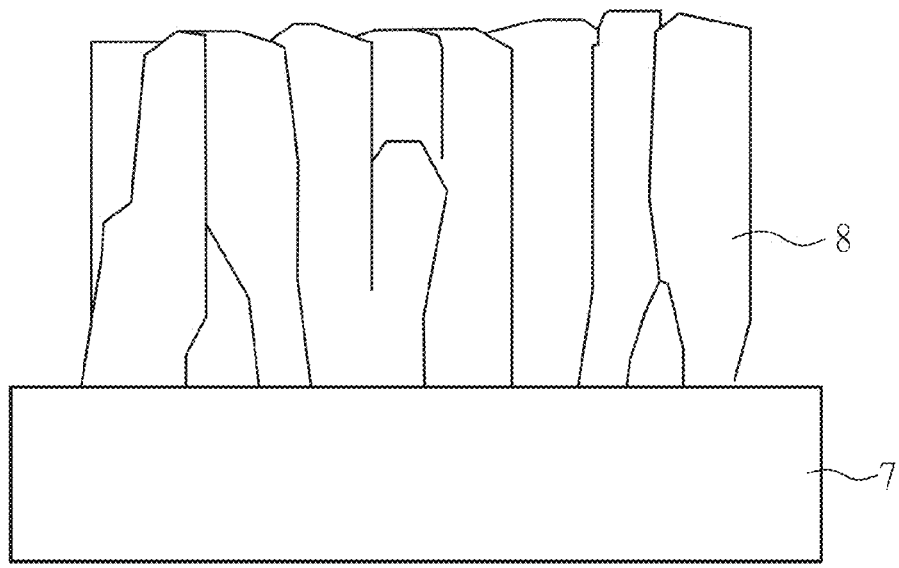
FIG. 5 is a schematic diagram of the silicon crystal with column structure of the crystallized silicon film according to Embodiment 1 of the present invention.

Furthermore, please refer to FIG. 4 and FIG. 5, FIG. 4 shows the SEM images of the cross-section view of the crystallized silicon films manufactured by applying different microwave powers, and FIG. 5 shows the column structures of the silicon crystals of the crystallized silicon film. According to these results, the crystallized silicon film manufactured by the present embodiment has a plurality of silicon crystals with column structures, and the schematic view thereof is shown in FIG. 5. Among the crystallized silicon film prepared by applying (a) 500 W, (b) 750 W, and (c) 1000 W microwave power, the heights of the silicon crystals with column structure are sequentially 2.11 μm, 2.02 μm, and 1.52 μm, and the particle sizes thereof are sequentially 61.40 nm, 69.81 nm, and 88.18 nm In other words, the converted growth rate of the crystallized silicon film is 1.6~92.34 nm/s.

Figure 6:
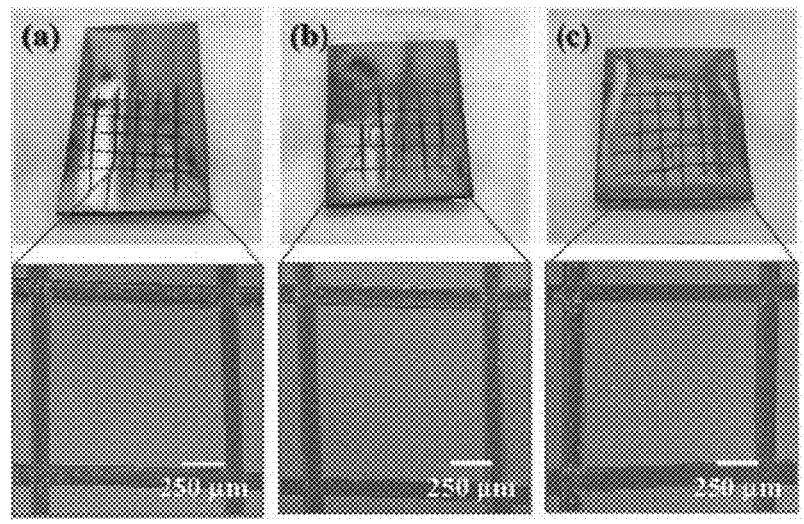
FIG. 6 is an outward appearance and an SEM image of the crystallized silicon film manufactured by applying different microwave power of (a) 500 W, (b) 750 W, and (c) 1000 W after the adhesion tape test according to Embodiment 1 of the present invention.

[Test Example 2]—Determining the Adhesion Between the Crystallized Silicon Film and the Substrate Please refer to FIG. 6, the adhesion tape tests of the crystallized silicon films manufactured in Embodiment 1 with 500 W, 750 W, and 1000 W microwave power are performed according to the ASTM 5339-02 method. The test is carried out by using Elcometer 107 Cross Hatch Cutter to draw crossed grids on the substrate with crystallized silicon film; attaching a tape (3M™ Scotch Brand Tape Core Serie 4-1000) onto the crossed grids; peeling off the tape; and observing the area percentage of the peeled area. Then, the peeled surface of the film is observed by scanning electron microscopy. Referring to the standard classification table, the adhesion levels of the crystallized silicon films manufactured by the above embodiments reach the highest level 5 B, and the excellent adhesion is also proved by the SEM image that the peeling of the crystallized silicon film from the substrate is not found.

Figure 7:
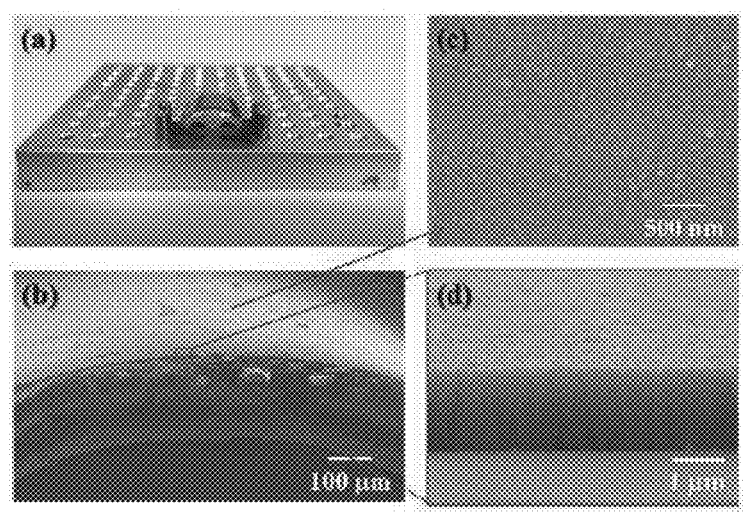
FIG. 7 is an outward appearance and an SEM image of the bended crystallized silicon film manufactured by applying 1000 W of microwave, wherein figure (a) shows the bending outward appearance, and figures (b), (c), and (d) are the SEM image according to Embodiment 1 of the present invention.

[Test Example 3]—Determining the Flexibility of the Crystallized Silicon Film of the Substrate with Crystallized Silicon Film Please refer to FIG. 7, the substrate having the crystallized silicon film manufactured by applying 1000 W of microwave power in Embodiment 1 is bended, and the outward appearance of the crystallized silicon film is observed in both macroscopic and microscopic scales.

FIG. 7(a) shows the image of the bended substrate with crystallized silicon film; FIG. 7(b) and FIG. 7(d) show the SEM images of the cross-section views thereof; and FIG. 7(c) shows SEM image from the top view thereof. According to the results show in FIG. 7, it can be found that the crystallized silicon film remains completely with no cracks occurred while the substrate with crystallized silicon film manufactured by the present embodiment is bended. As a result, the crystallized silicon film manufactured by the method of the present embodiment does have excellent flexibility.

[Test Example 4]—Determining the Optoelectronic Properties of the Crystallized Silicon Film on the Substrate The substrates with the crystallized silicon films manufactured by applying 500 W, 750 W, and 1000 W of microwave power in Embodiment 1 are bended in different angles to determine their dark conductivity and their photoconductivity.

Figure 8:
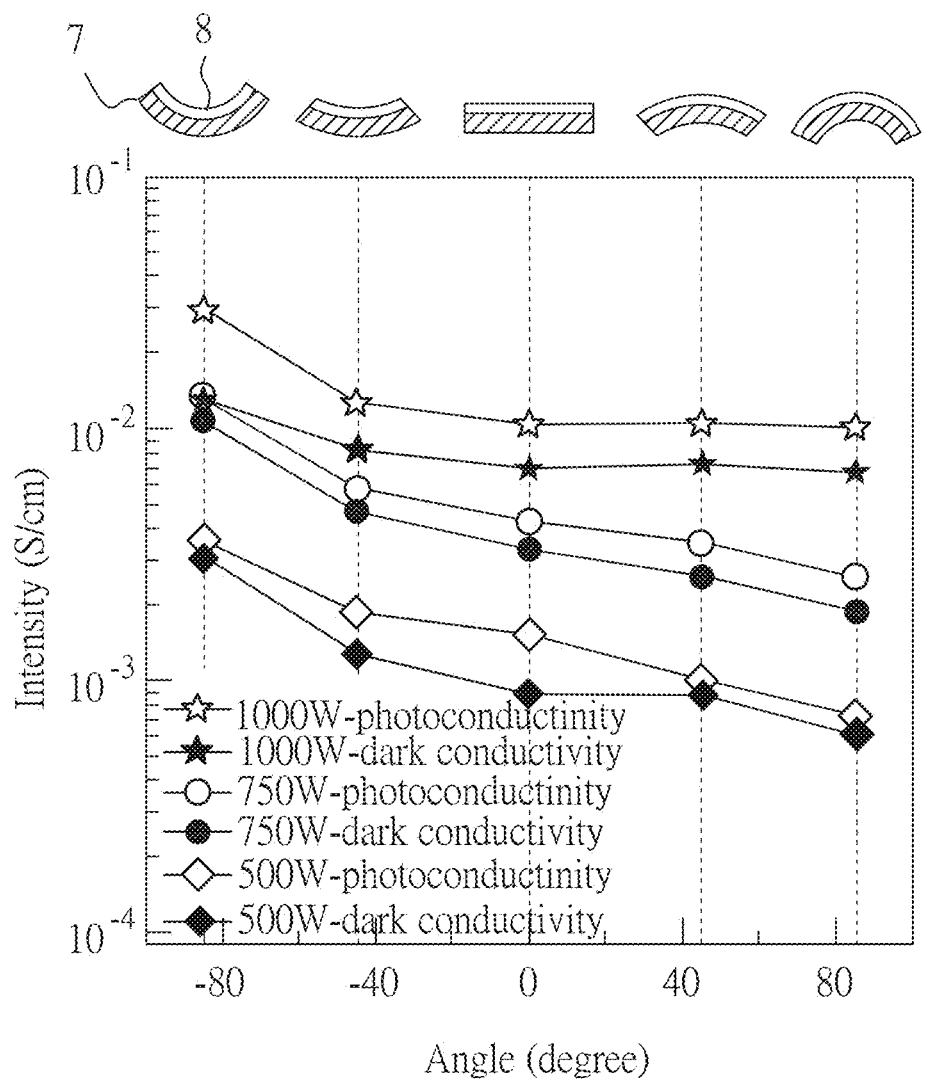
FIG. 8 is a graph of the conductivity test results of the bended crystallized silicon film manufactured in Embodiment 1 of the present invention.

The results are shown in FIG. 8, wherein the crystallized silicon films manufactured by applying different microwave power have excellent conductivity higher than $10^{-3}$ S/cm. Further, under the irradiation of the stimulated sun light, the conductivity and the photoconductivity thereof are improved, which indicate that the crystallized silicon film has light response characteristics.

In addition, excellent conductivity is exhibited when the substrate 7 with the crystallized silicon film 8 is bended in a positive angle (larger than) 0°, that is, the crystallized silicon film is under a tensile stress. Moreover, the conductivity is improved when the substrate 7 with crystallized silicon film 8 is bended in a negative angle (smaller than 0°), that is, the crystallized silicon film is under a compression stress. The results show that the crystallized silicon film exhibits excellent optoelectronic properties when the crystallized silicon film is bended.

Figure 9:
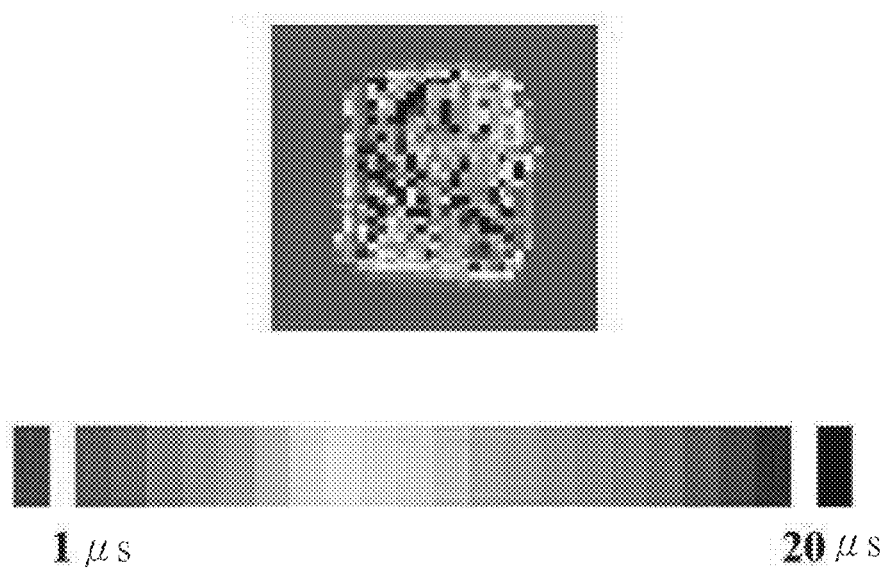
FIG. 9 is the measured result of the carrier life time of the crystallized silicon film manufactured by applying 1000 W of microwave in Embodiment 1 of the present invention.

As shown in FIG. 9, the carrier life time of the crystallized silicon film of the substrate manufactured by applying 1000 W microwave power in Embodiment 1 is tested. According to the distribution of the color block shown in FIG. 9, the carrier lifetime of the crystallized silicon film is about 10~20 μs.

Embodiment 2

Figure 10:
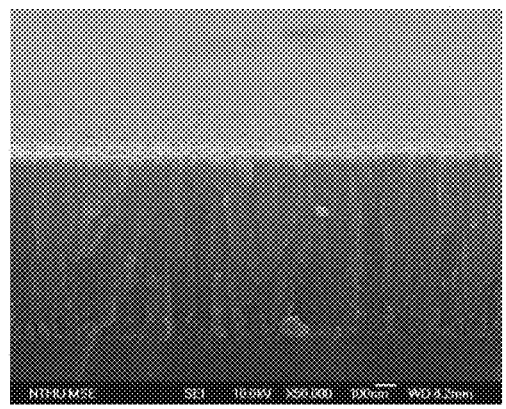
FIG. 10 is an SEM image of the crystallized silicon film of Embodiment 2 of the present invention.
Figure 11:
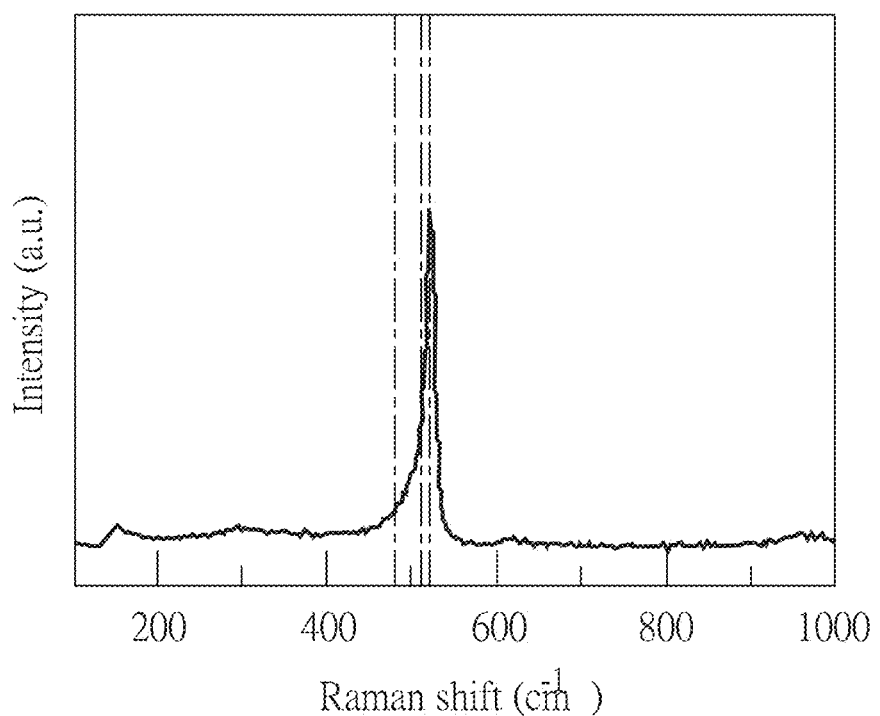
FIG. 11 is a Raman spectroscopy of the crystallized silicon film according to Embodiment 2 of the present invention.

The manufacturing devices and method of the present embodiment are almost the same as those described in Embodiment 1, except that the present embodiment uses $Si_2Cl_6$ as the silicon source which is preserved in a 15° C. condensing well device 1, the applied microwave power is 1000 W, and the reaction time is 5 minutes. The substrate with crystallized silicon film accomplished by the present embodiment is shown in FIG. 10. According to FIG. 10, the silicon crystal with column structures is able to be formed on the flexible substrate while using $Si_2Cl_6$ as the silicon source.

Further, it can be confirmed that the crystallized silicon film of the present embodiment has a peak at Raman shift of 520 $cm^{-1}$.

Embodiment 3

The manufacturing devices and method of the present embodiment are almost the same as those described in Embodiment 1, while the differences is that the flow rate of the additional hydrogen gas are respectively (a) 50 sccm, (b) 100 sccm, (c) 200 sccm, (d) 300 sccm, (e) 400 sccm, and (f) 600 sccm in the present embodiment.

Figure 12:
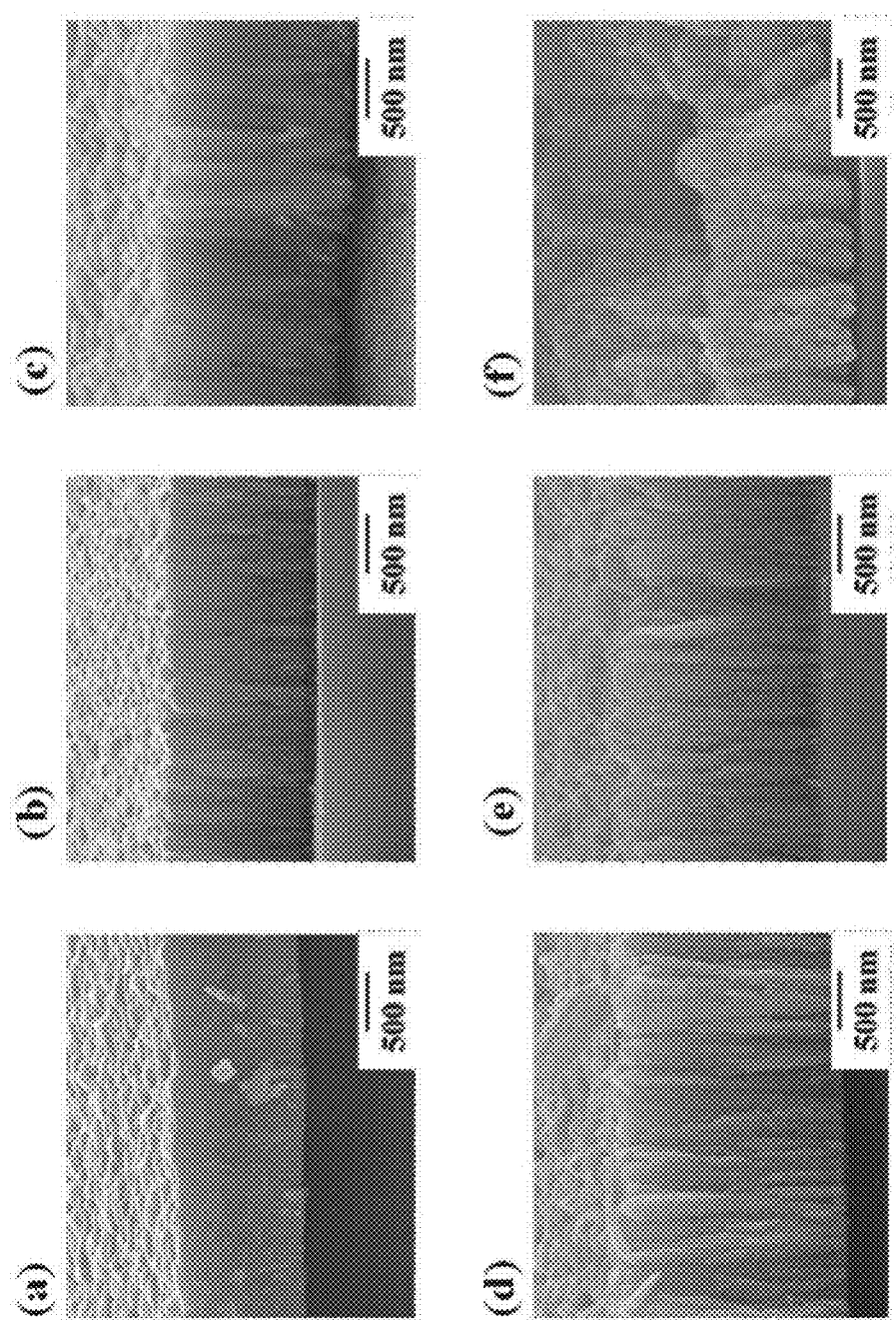
FIG. 12 is an SEM image of the crystallized silicon film manufactured with hydrogen carrier gas having flow rates of (a) 50 sccm, (b) 100 sccm, (c) 200 sccm, (d) 300 sccm, (e) 400 sccm, and (f) 600 sccm according to Embodiment 3 of the present invention.
Figure 13:
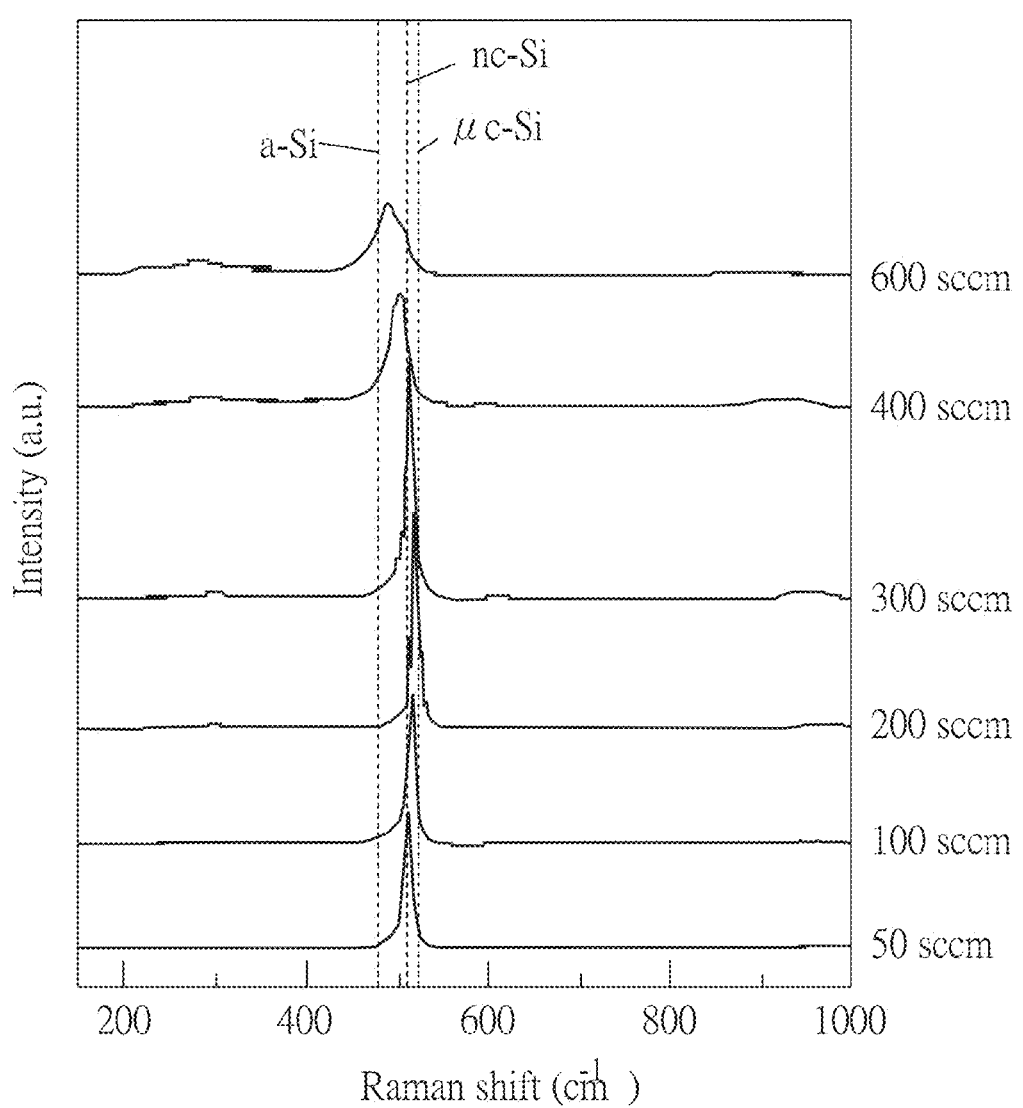
FIG. 13 is a Raman spectroscopy of the crystallized silicon film manufactured with hydrogen carrier gas having flow rates of 50 sccm, 100 sccm, 200 sccm, 300 sccm, 400 sccm, and 600 sccm according to Embodiment 3 of the present invention.

As the results of the SEM images and the Raman spectroscopy of the present embodiment shown in FIG. 12 and FIG. 13, it is found that the flow rate of the hydrogen gas may affect the crystal structures of the crystallized silicon films. When the flow rate of the hydrogen gas is 100~300 sccm, the crystallized silicon film with column structures can be formed, and the heights of the silicon crystals with the column structures are respectively (a) 1.10 μm, (b) 1.28 μm, (c) 1.52 μm, (d) 1.91 μm, (e) 1.74 μm, and (f) 1.23 μm. The crystallized silicon film with the best quality can be formed when the flow rate of the hydrogen gas is 200 sccm.

In summary, the present invention is capable of forming a crystallized silicon film with high crystallinity on a flexible substrate with low melting point in a low-temperature process. In addition, according to the test results, it can be found that the crystallized silicon film is composed of silicon crystals with column structures, and the crystallinity thereof can reach 97%. The other test results of the crystallized silicon film also show that the crystallized silicon film has excellent adhesion, flexibility, and optoelectronic properties. Further, according to the results of the Hall measurement, the crystallized silicon film manufactured under the conditions that the applied power is 1000 W and the flow rate of the hydrogen carrier gas is 200 sccm has a carrier mobility of about 100~150 $cm^2$/Vs.

Although the present invention has been explained in relation to its preferred embodiment, it is to be understood that many other possible modifications and variations can be made without departing from the spirit and scope of the invention as hereinafter claimed.

What is claimed is:

1. A manufacturing method of a substrate with a crystallized silicon film, comprising the steps of:

(A) providing a substrate, a silicon source, and a hydrogen gas, wherein the substrate is a polymer substrate, and the silicon source is a liquid silicon source selected from the group consisting of $SiCl_4$, $Si_2Cl_6$ and a combination thereof;

(B) placing the substrate into a reduced pressure environment of a pressure less than $10^{-2}$ torr, and using the hydrogen gas as a carrier gas to introduce the silicon source into the reduced pressure environment, wherein a flow rate of the carrier gas is 10-20 sccm, and the carrier gas of the hydrogen gas is injected into the liquid silicon source to introduce vapor of the liquid silicon source into the reduced pressure environment;

(C) introducing 50~600 sccm of the carrier gas additionally, and performing a microwave plasma enhanced chemical vapor deposition (MWPECVD) with a microwave power of 250~2000 W under an operation pressure of 1~10 torr; and (D) depositing a crystallized silicon film on at least one surface of the substrate to form the substrate with the crystallized silicon film.

2. The manufacturing method as claimed in claim 1, wherein in the step of (C), the MWPECVD is performed with a plasma density of $10^{12}$~$10^{13}$ under a temperature of 200° C. or less.

3. The manufacturing method as claimed in claim 1, wherein the substrate with the crystallized silicon film comprises:

the substrate, which is the polymer substrate; and
the crystallized silicon film, which is formed on at least one surface of the substrate, wherein a crystallinity of the crystallized silicon film is higher than 90%, and the crystallized silicon film comprises a plurality of silicon crystals with column structures, wherein an X-ray diffraction pattern of the crystallized silicon film measured by Cu Kα irradiation has diffraction peaks at 20~60 degree.

4. The manufacturing method as claimed in claim 1, wherein the crystallized silicon film has a peak at Raman shift of 510~520 $cm^{-1}$.

5. The manufacturing method as claimed in claim 1, wherein the silicon crystals of the crystallized silicon film have a preferred crystalline orientation of [220].

6. The manufacturing method as claimed in claim 1, wherein a growth rate of the crystallized silicon film is 100 nm/min to 150 nm/min.

7. The manufacturing method as claimed in claim 1, wherein the substrate is a flexible polymer substrate.

8. The manufacturing method as claimed in claim 1, wherein an adhesion level of the crystallized silicon film to the substrate is 5 B measured by the ASTM D3359-02 test method.

9. The manufacturing method as claimed in claim 1, wherein a conductivity of the crystallized silicon film is $10^{-3}$~$10^{-1}$ S/cm.

10. The manufacturing method as claimed in claim 1, wherein a carrier mobility of the crystallized silicon film is 100~150 $cm^2$/Vs.

11. The manufacturing method as claimed in claim 1, wherein a carrier lifetime of the crystallized silicon film is 10~20 μs.

* * * * *